United States Patent
Bulja et al.

(10) Patent No.: US 11,201,634 B2
(45) Date of Patent: Dec. 14, 2021

(54) RADIO-FREQUENCY SWITCHING APPARATUS

(71) Applicant: Nokia Technologies Oy, Espoo (FI)

(72) Inventors: Senad Bulja, Dublin (IE); Dirk Wiegner, Schwaikheim (DE); Wolfgang Templ, Sersheim (DE); Rose Kopf, Green Brook, NJ (US)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 17/178,700

(22) Filed: Feb. 18, 2021

(65) Prior Publication Data

US 2021/0306020 A1    Sep. 30, 2021

(30) Foreign Application Priority Data

Mar. 27, 2020    (EP) .................................... 20166344

(51) Int. Cl.
| | |
|---|---|
| H04B 1/16 | (2006.01) |
| H04B 1/03 | (2006.01) |
| H03H 7/21 | (2006.01) |

(52) U.S. Cl.
CPC ............. *H04B 1/1615* (2013.01); *H03H 7/21* (2013.01); *H04B 1/03* (2013.01)

(58) Field of Classification Search
CPC combination set(s) only.
See application file for complete search history.

(56) References Cited

U.S. PATENT DOCUMENTS

| | | | |
|---|---|---|---|
| 4,163,982 A | 8/1979 | Di Domenico, Jr. et al. | |
| 4,245,883 A | 1/1981 | Johnson et al. | |
| (Continued) | | | |

FOREIGN PATENT DOCUMENTS

| | | | |
|---|---|---|---|
| EP | 1796203 A1 | 6/2007 | |
| EP | 2416390 A1 | 2/2012 | |
| (Continued) | | | |

OTHER PUBLICATIONS

Reck et al., "A 700-GHz MEMS Waveguide Switch", IEEE Transactions on Terahertz Science and Technology, vol. 6, No. 4, Jul. 2016, pp. 641-643.

(Continued)

*Primary Examiner* — Junpeng Chen
(74) *Attorney, Agent, or Firm* — Harrington & Smith

(57) ABSTRACT

A radio-frequency switching apparatus that can be used to turn a signal path on or off or to attenuate a radio-frequency signal. The switching apparatus comprises at least one radio-frequency input, at least one radio-frequency output, at least one transmission line providing a signal path between the at least one radio-frequency input and the at least one radio-frequency output, and at least one transition metal oxide portion. The radio-frequency switching apparatus also comprises direct current blocking means electrically coupled between the at least one transition metal portion and the at least one radio-frequency input. The radio-frequency switching apparatus also comprises biasing means for providing a bias across the at least one transition metal oxide portion such that power transferred between the radio-frequency input and the radio-frequency output is controlled by controlling the bias level across the at least one transition metal oxide portion.

20 Claims, 9 Drawing Sheets

(56) References Cited

U.S. PATENT DOCUMENTS

| | | | | |
|---|---|---|---|---|
| 6,020,787 | A * | 2/2000 | Kim | H03F 1/0233 330/279 |
| 7,535,312 | B2 * | 5/2009 | McKinzie, III | H03H 7/40 333/17.3 |
| 9,130,543 | B2 * | 9/2015 | McKinzie | H03H 11/30 |
| 9,548,716 | B2 * | 1/2017 | Manssen | H03H 7/40 |
| 9,698,748 | B2 * | 7/2017 | Manssen | H01Q 1/242 |
| 10,187,107 | B1 | 1/2019 | Bulja et al. | |
| 2005/0200427 | A1 | 9/2005 | Hersey et al. | |
| 2007/0200766 | A1 | 8/2007 | Mckinzie, III et al. | |
| 2007/0285326 | A1 * | 12/2007 | McKinzie | H01Q 5/321 343/746 |
| 2008/0030837 | A1 | 2/2008 | Ashrit et al. | |
| 2008/0106350 | A1 | 5/2008 | Mckinzie | |
| 2010/0097120 | A1 * | 4/2010 | Bizien | H01P 1/15 327/493 |
| 2015/0200363 | A1 | 7/2015 | Sacchetto et al. | |
| 2015/0323576 | A1 | 11/2015 | Bulja et al. | |
| 2015/0325897 | A1 | 11/2015 | Bulja et al. | |
| 2016/0154290 | A1 | 6/2016 | Brown et al. | |
| 2019/0229808 | A1 | 7/2019 | Calhoun et al. | |

FOREIGN PATENT DOCUMENTS

| | | |
|---|---|---|
| EP | 3319165 A1 | 5/2018 |
| JP | 2008533536 A | 8/2008 |
| JP | 2018113667 A | 7/2018 |
| WO | 2006/098553 A1 | 9/2006 |

OTHER PUBLICATIONS

Feng et al., "High Performance 500-750 GHz RF MEMS Switch", IEEE MTT-S International Microwave Symposium (IMS), Jun. 4-9, 2017, pp. 105-1097.

Mortimer, "Electrochromic Materials", The Annual Review of Materials Research, vol. 41, 2011, pp. 241-268.

Granqvist, "Handbook of Inorganic Electrochromic Materials", Elsevier, 1995, 651 pages.

Allowance received for corresponding U.S. Appl. No. 15/959,564, dated Oct. 2, 2018, 8 pages.

Jiang et al., "Fabrication and Characterization of VO2-Based Series and Parallel RF switches", IEEE MTT-S International Microwave Symposium (IMS), 2017, pp. 278-280.

Madan et al., "26.5 Terahertz electrically triggered RF switch on epitaxial VO2-on-Sapphire (VOS) wafers", IEEE International Electron Devices Meeting (IEDM), 2015, pp. 1-4.

Misra et al., "Studies on Resistive Switching Times in NiO Thin Films Grown by Pulsed Laser Deposition", Journal of Physics D: Applied Physics, vol. 50, No. 41, 2017, pp. 1-3.

Extended European Search Report received for corresponding European Patent Application No. 19168828.2, dated Jan. 28, 2020, 9 pages.

Allowance received for corresponding Japanese Patent Application No. 2019-079852, dated May 12, 2020, 3 pages of office action and no pages of Translation available.

Bulja et al., "High Frequency Dielectric Characteristics of Electrochromic, WO3 and NiO Films with LiNbO3 Electrolyte", Scientific Reports, vol. 6, 2016, pp. 1-8.

Bulja et al., "Tuneable Dielectric and Optical Characteristics of Tailor-Made Inorganic Electro-Chromic Materials", Scientific Reports, vol. 7, 2017, pp. 1-8.

Yoshimatsu et al., "Insulator-to-Metal Transition of WO3 Epitaxial Films Induced by Electrochemical Li-ion Intercalation", Applied Physics Express, vol. 9, No. 7, 2016, pp. 1-18.

Kwon et al., "Atomic Structure of Conducting Nanofilaments in TiO2 Resistive Switching Memorys", Nature Nanotechnology, vol. 5, Jan. 17, 2010, pp. 148-153.

Zhang et al., "Gd-Doping Effect on Performance of HfO2 Based Resistive Switching Memory Devices Using Implantation Approach", Applied Physics Letters, vol. 98, No. 4, 2011, pp. 1-3.

Li et al., "Investigation of Resistive Switching Behaviours in WO3-based RRAM Devices", Chinese Physics B, vol. 20, No. 1, 2011, pp. 1-7.

Kim et al., "Anode-Interface Localised Filamentary Mechanism in Resistive Switching of TiO2 Thin Films", Applied Physics Letters, vol. 91, No. 1, 2007, pp. 1-3.

Nauenheim et al., "Investigation of the Electroforming Process in Resistively Switching TiO2 Nanocrosspoint Junctions", Applied Physics Letters, vol. 96, No. 12, 2010, pp. 1-3.

U.S. Appl. No. 16/562,871, "Electrically Tunable Radio-Frequency Components and Circuits", filed Sep. 6, 2019, 28 pages.

Bulja et al., "Theory, Analysis and Design of High Order Reflective, Absorptive Filters", IET Microwaves, Antennas & Propagation, vol. 11, No. 6, 2017, pp. 787-795.

Pergament et al., "Vanadium Dioxide: Metal-insulator Transition, Electrical Switching and Oscillations. a Review of State of the Art and Recent Progress", arXiv, 2015, pp. 1-25.

Mahanta et al., "Performance Comparison of Phase Change Materials and Metal-insulator Transition Materials for Direct Current and Radio Frequency Switching Applications", Technologies, vol. 6, 2018, pp. 1-26.

Chudnovskii et al., "Electroforming and Switching in Oxides of Transition Metals: the Role of Metal-insulator Transition in the Switching Mechanism", Journal of Solid State Chemistry, vol. 122, No. 1, 1996, pp. 95-99.

Extended European Search Report received for corresponding European Patent Application No. 20166344.0, dated Sep. 10, 2020, 10 pages.

* cited by examiner

RADIO-FREQUENCY SWITCHING APPARATUS

TECHNOLOGICAL FIELD

Embodiments of the present disclosure relate to a radio-frequency switching apparatus. Some relate to radio-frequency switching apparatus comprising transition metal oxides.

BACKGROUND

Radio-frequency switching apparatus can be used to turn a signal path on or off. For instance, where a device comprises a plurality of antenna systems one or more radio-frequency switching apparatus can be used to switch the different antennas on or off.

BRIEF SUMMARY

According to various, but not necessarily all, examples of the disclosure there is provided, a switching apparatus comprising: at least one radio-frequency input; at least one radio-frequency output; at least one transmission line providing a signal path between the at least one radio-frequency input and the at least one radio-frequency output; at least one transition metal oxide portion; direct current blocking means electrically coupled between the at least one transition metal portion and the at least one radio-frequency input; and biasing means for providing a bias across the at least one transition metal oxide portion such that power transferred between the radio-frequency input and the radio-frequency output is controlled by controlling the bias level across the at least one transition metal oxide portion.

The biasing means may be for providing a direct current bias. The biasing means may be for providing a modulated biasing signal.

When bias is controlled so that the at least one transition metal oxide portion is in an insulating state the switching apparatus is closed and power is transferred via the transmission line between the radio-frequency input and the radio-frequency output.

When bias is controlled so that the at least one transition metal oxide portion is in an, at least partially, conducting state the switching apparatus is, at least partially, open and at least some of the power provided to the radio-frequency input is not transferred to the radio-frequency output.

When bias is controlled so that the switching apparatus is, at least partially, open at least some of the power provided to the radio-frequency input may be transferred through the at least one transition metal oxide portion.

The direct current blocking means may be electrically coupled between the at least one transmission metal portion and the at least one transmission line.

The direct current blocking means may comprise one or more capacitors.

The switching apparatus may comprise at least one coupling means for coupling a plurality of transition metal oxide portions to the transmission line.

The coupling means may comprise a four-port coupler.

The bias level applied by the biasing means may be selected to match the impedance of the at least one transition metal oxide portion to a load impedance.

The switching apparatus may comprise a plurality of coupling means connected in series and one or more transition metal oxide portions coupled to each of the coupling means.

The switching apparatus may comprise two transition metal oxide portions coupled to the same port of the coupling means via two different transmission lines.

The switching apparatus may comprise a plurality of stub lines coupled to transition metal oxide portions wherein the stub lines are designed in electrical length to block selected frequencies.

The electrical lengths of the stub lines may be tuned using electrochromic material.

The switching apparatus may comprise a plurality of radio-frequency outputs wherein different stub lines may be coupled to different radio-frequency outputs to enable different frequency signals to be provided at the different radio-frequency outputs.

According to various, but not necessarily all, examples of the disclosure there is provided, a switching apparatus comprising: at least one radio-frequency input; at least one radio-frequency output; at least one transmission line providing a signal path between the at least one radio-frequency input and the at least one radio-frequency output; at least one transition metal oxide portion; direct current blocking circuitry electrically coupled between the at least one transition metal portion and the at least one radio-frequency input; and biasing circuitry configured to provide a bias across the at least one transition metal oxide portion such that power transferred between the radio-frequency input and the radio-frequency output is controlled by controlling the bias level across the at least one transition metal oxide portion.

BRIEF DESCRIPTION

Some examples will now be described with reference to the accompanying drawings in which.

DETAILED DESCRIPTION

Examples of the disclosure relate to radio-frequency switching apparatus 101. The example radio-frequency switching apparatus 101 can be used to turn a signal path on or off or to attenuate a radio-frequency signal.

Figure 1:
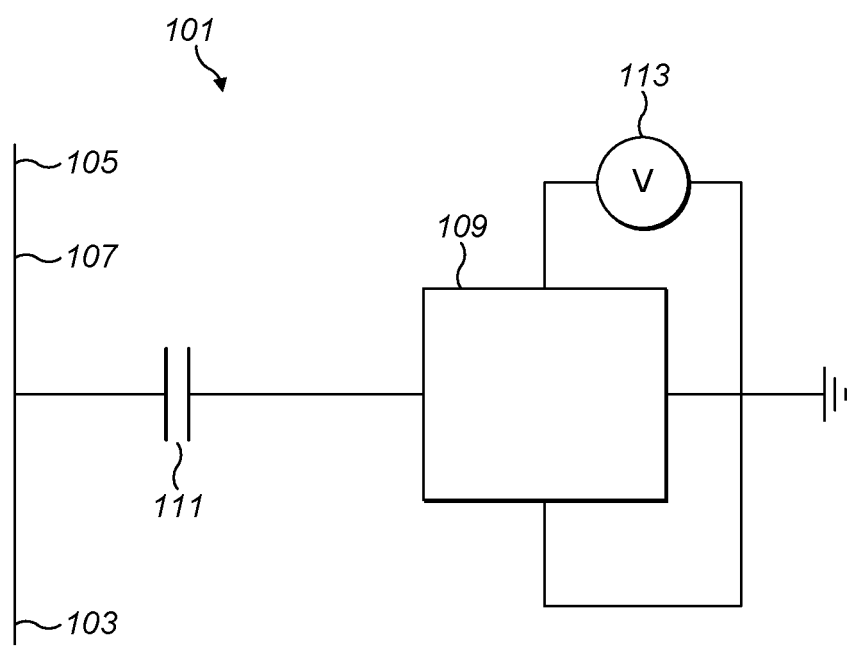
FIG. 1 shows an example of the subject matter described herein.

FIG. 1 schematically illustrates a radio-frequency switching apparatus 101 according to examples of the disclosure. The switching apparatus 101 comprises a radio-frequency input 103, a radio-frequency output 105, a transmission line 107, at least one transition metal oxide portion 109, direct current blocking means 111 and biasing means 113. It is to be appreciated that only features referred to in the following description are shown in FIG. 1 and that in implementations of the disclosure the switching apparatus 101 could comprise additional components.

The radio-frequency input 103 comprises any means for providing a radio-frequency signal to the switching apparatus 101. The input 103 may be coupled to any suitable components that are configured to provide the radio-frequency signal.

The input signal provided to the input 103 comprises an alternating current signal. The frequency of the input signal can be between 20 kHz to 300 GHz or within any suitable range.

The radio-frequency output 105 comprises any means for providing an output signal from the switching apparatus 101 to another component. The output 105 could be coupled to one or more electronic components. For example, the output 105 could be coupled to one or more antennas. The components that are coupled to the output 105 have a load impedance $Z_0$.

The transmission line 107 provides a signal path between the input 103 and the output 105. The transmission line 107 provides a continuous waveguiding path between the input 103 and the output 105. In some examples the transmission line 107 provides a continuous conductive path between the input 103 and the output 105. In such examples the transmission line 107 can comprise a conductive material. In other examples a non-conductive material such as polymer fibers can be used for the transmission line 107.

The switching apparatus 101 also comprises at least one transition metal oxide portion 109. The transition metal oxide portion 109 can comprise any suitable transition metal oxide or combination of transition metal oxides. The transition metal oxide could comprise Titanium dioxide ($TiO_2$), Vanadium dioxide ($VO_2$) Nickel oxide (NiO) or any other suitable transition metal oxide or combinations of transition metal oxides.

The transition metal oxide portion 109 comprises a transition metal oxide that undergoes a transition from an electrical insulator to an electrical conductor when a direct current bias is applied to the transition metal oxide. The impedance of the transition metal oxide portion 109 may be determined by the bias voltage that is applied across the transition metal oxide portion 109.

The transition metal oxide portion 109 is provided between the transmission line 107 and a ground. The transition metal oxide portion 109 is electrically coupled to the transmission line 107 and the ground so that, when the transition metal oxide portion 109 is in a conductive state a radio-frequency signal can be transferred from the input 103 to the ground via the transition metal oxide portion 109.

The switching apparats 101 also comprises biasing means 113. The biasing means 113 comprises circuitry that can be configured to provide a bias to the one or more transition metal oxide portions 109. The biasing means 113 can be configured to provide direct current bias.

The biasing means 113 may be configured to be switched on or off as needed.

The biasing means 113 can be configured to avoid leakage of the radio frequency signals through the biasing means 113. In such examples the apparatus 101 can comprise radio frequency blocking means configured to block at least the frequency range of the input signal. In some examples the apparatus 101 can be configured to enable modulation via the biasing means 113. In such examples the apparatus 101 can be configured to allow transmission of the modulation frequency.

In some examples the biasing means 113 can be operated in an analogue mode. In the analogue mode the bias applied to the transition metal oxide portion 109 can be varied between $V_o$ and $V_{max}$ where $V_0$ is lower than $V_{max}$. In some examples the bias can be varied continuously within the range $V_o$ and $V_{max}$. $V_o$ could be a value at which the transition metal oxide behaves as an insulator. $V_{max}$ could be a value at which the transition metal oxide acts as conductor.

In some other examples, the biasing means 113 can also be used to modulate the radio frequency input signal. In such examples the bias provided by the biasing means to the transition metal oxide portions 109 would be modulated rather than direct current. The modulated control voltage is then imposed to the input signal provided to the input 103.

In some examples the biasing means 113 can be operated in a discrete mode. In the discrete mode the bias applied to the transition metal oxide portion 109 can have one of number of set values. For example, in a discrete mode with two states the bias could be set either to $V_o$ or $V_{max}$.

In examples where the biasing means 113 is operated in a discrete mode the set values can be stored in a look up table or other suitable means. The set values can be stored with other useful data such as the attenuations related to the set values. The set values can then be recalled for use by the biasing means 113 when needed. The stored set values can comprise values which enable specific attenuation states to be attained. For example the stored set values could comprise the values for the maximum and minimum attenuation states and any other relevant attenuation states.

The switching apparatus also comprises direct current blocking means 111. The direct current blocking means 111 comprises a capacitor or any other means which enables an alternating current signal to be transferred but prevents a direct current signal from being transferred.

In the example switching apparatus 101 the direct current blocking means 111 is electrically coupled between the transition metal oxide portion 109 and the transmission line 107. The direct current blocking means 111 enables an alternating current signal to be transferred from the input 103 to the transition metal oxide portion 109 but prevents any direct current signal from the biasing means 113 being transferred to the transmission line 107. The direct current blocking means 111 is connected in series with the transition metal oxide portion 109. The direct current blocking means 111 is connected in series between the transmission line 107 and the transition metal oxide portion 109.

When the switching apparatus 101 is in an "on" state the biasing means 113 is configured so that no bias, or a low bias, is applied to the transition metal oxide portion 109. This causes the transition metal oxide portion 109 to act as an insulator and prevents the radio-frequency signal from the input 103 from being transferred to the ground. The radio-frequency input signal that is provided to the input 103 is transferred to the output 105 via the transmission line 107. This enables power to be transferred between the input 103 and the output 105 via the transmission line 107.

When the switching apparatus 101 is in an "off" state the biasing means 113 is configured so that a bias is applied to the transition metal oxide portion 109. This causes the transition metal oxide 109 to act as a conductor and allows, at least some of, the input radio-frequency signal to be provided to ground via the transition metal oxide portion 109. In some examples the bias voltage can be selected so that the impedance of the transition metal oxide portion 109 enables all of, or almost all of, the input signal to be provided to ground so that none of, or almost none of, the input signal is provided to the output 105. This can prevent power from being transferred between the input 103 and the output 105 via the transmission line 107. In some examples this can attenuate the power being transferred between the input 103 and the output 105. In some examples the biasing means 113 can also apply modulation to the input radio-frequency signal.

In the example switching apparatus 101 when the switch is turned off the transition metal oxide portion 109 provides a signal path for the input radio-frequency signal. This allows the input radio-frequency signal to be provided to ground rather than to the output 105. As the input radio-frequency signal can be provided to ground this can also reduce unwanted reflections of the input signal at the end of the output 105 and help to prevent signals being reflected back towards the input 103.

In some examples the bias voltage can be controlled to tune the impedance of the transition metal oxide portion 109. This can enable the impedance of the transition metal oxide portion to be tuned to match a load impedance $Z_0$. This can help to reduce or minimize reflections of the signals within the switching apparatus 101.

The switching apparatus 101 could be operated bi-directionally. That is, the input 103 and the output 105 can be interchangeable so that the input signal could be provided to either end of the transmission line 107 without affecting the functioning of the switching apparatus 101.

Figure 2:
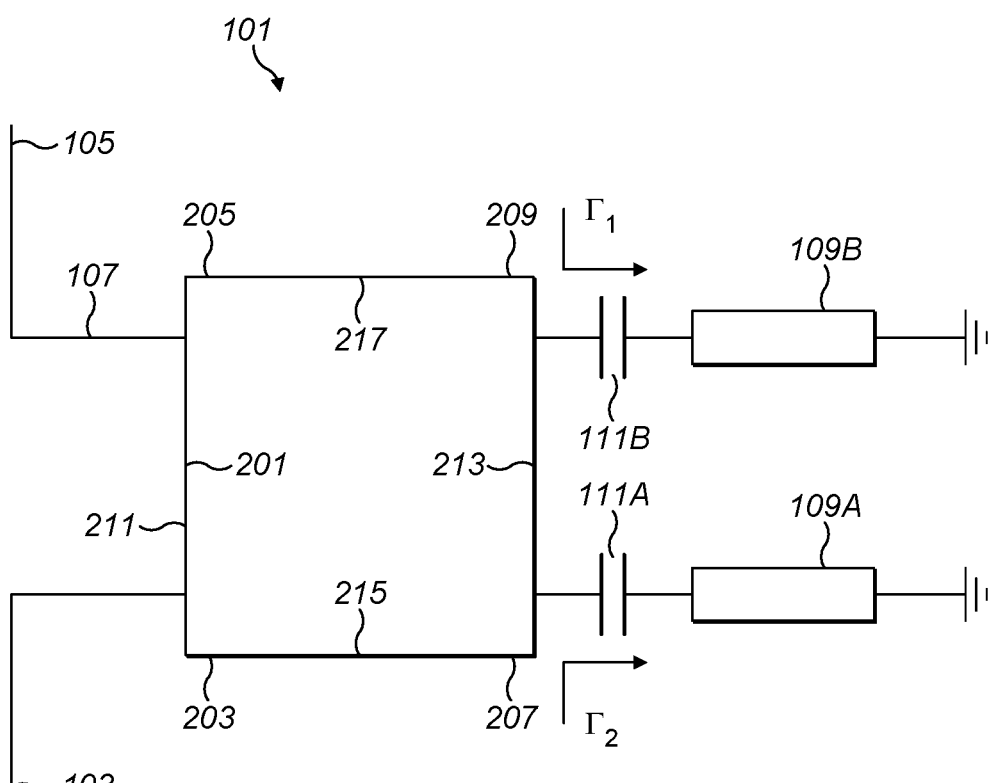
FIG. 2 shows another example of the subject matter described herein.

FIG. 2 schematically illustrates another switching apparatus 101 according to examples of the disclosure. The switching apparatus 101 in FIG. 2 comprises an input 103, an output 105, coupling means 201, two transition metal oxide portions 109 and two direct current blocking means 111. The switching apparatus 101 also comprises biasing means 113 for providing a bias to the transition metal oxide portions 109 however this is not shown in FIG. 2 for clarity. The biasing means 113 can provide direct current bias. The biasing means 113 can be a common biasing means 113 for providing bias to all of the transition metal oxide portions 109. In some examples a plurality of biasing means 113 can be provided and configured so that different biasing means 113 can provide bias to different transition metal oxide portions 109.

The input 103 and the output 105 can be as described above. A transmission line 107 provides a continuous waveguiding path between the input 103 and the output 105. It is to be appreciated that the switching apparatus 101 in FIG. 2 can be operated bi-directionally so that the input 103 and the output 105 can be interchanged.

The coupling means 201 comprise any means for coupling one or more transition metal oxide portions to the transmission line 107. In the example of FIG. 2 the coupling means 201 is configured to coupled two transition metal oxide portions 109 to the transmission line 107. The transition metal oxide portions 109 could be as described above.

In the example of FIG. 2 the coupling means 201 comprises a four-port coupler. The coupling means 201 comprises four ports 203, 205, 207, 209 and four arms 211, 213, 215, 217. The four arms 211, 213, 215, 217 connect the four ports 203, 205, 207, 209 so that the four arms 211, 213, 215, 217 provide a continuous waveguiding path between each of the four ports 203, 205, 207, 209.

The input 103 is coupled to a first port 203 of the coupling means 201 and the output 105 is coupled to a second port 205 of the coupling means 201. The arm 211 that connects the first port 203 and the second port 205 therefore provides part of a continuous conductive path between the input 103 and the output 105.

A first transition metal oxide portion 109A is coupled to a third port 207 of the coupling means and a second transition metal oxide portion 109B is coupled to a fourth port 209 of the coupling means 201. The direct current blocking means 111A, B are provided between the ports 207, 209 of the coupling means 201 and the transition metal oxide portions 109A, 109B respectively. A first direct current blocking means 111A is provided between the third port 207 and the first transition metal oxide portion 109A and a second direct current blocking means 111B is provided between the fourth port 209 and the second transition metal oxide portion 109B. This prevents direct current from the biasing means 113 from being transferred to the coupling means 201 and the transmission line 107.

In some examples the direct current blocking means 111A can also be configured to block at least the frequency range of the input signal. In examples where the apparatus 101 can be configured to enable modulation via the biasing means 113 direct current blocking means 111A can be configured to allow transmission of the modulation frequency.

In the example switching apparatus 101 of FIG. 2, when the biasing means 113 is in an off state the transition metal oxide portions 109A, 109B provide insulating portions. This causes the transition metal oxide portions 109A, 109B to behave as open circuits. In this configuration all of, or almost all of, the power provided by the input signal will be transferred from the input 103 to the output 105. In this low attenuation state the switching apparatus 101 behaves as a transmission line.

When the biasing means 113 is turned on the transition metal oxide portions 109 become conductive. The biasing means 113 can be turned on gradually so that the conductivity of the transition metal oxide portions 109 also increases gradually. As the transition metal oxide portions 109 become conductive the incoming signal will be dissipated across the transition metal oxide portions 109.

When the bias applied by the biasing means is such that the impedance of the transition metal oxide portions 109A, 109B are equal to the characteristic impedance of the coupling means 201 than all, or substantially all, of the power would be transferred through the transition metal oxide portions 109A, 109B to ground and none, or substantially none, of the power would be provided to the output 105. This provides isolation between the input 103 and the output 105.

The scattering parameters of the switching apparatus 101 of FIG. 2 are given by equations (1) and (2):

$$S_{11} = j(\Gamma_1 - \Gamma_2) \quad (1)$$

$$S_{21} = j(\Gamma_1 + \Gamma_2) \quad (2)$$

Where $S_{11}$ is the input voltage reflection coefficient of the input port 103 of the switching apparatus 101 and $S_{21}$ is the forward voltage gain from the input port 103 to the output port 105 and $\Gamma_1$ and $\Gamma_2$ are the reflection coefficients of the respective transition metal oxide portions 109. It is to be appreciated that the switching apparatus 101 can be operated bi-directionally.

These equations show that if the reflective coefficients of the transition metal oxide portions 109 match the reflective coefficients of any load coupled to the switching apparatus 101 through the output 105 such that $\Gamma_1 = \Gamma_2 = \Gamma_0$ then there is no reflection within the switching apparatus 101. This means that all power, or substantially all power, provided to the input 103 is transferred to the transition metal oxide portions 109. This enables the switching apparatus 101 to be opened to prevent a signal being transferred between the input 103 and the output 105.

The impedance and the reflective coefficients of the transition metal oxide portions 109 is determined by the bias level applied by the biasing means 113. A bias level can be selected to match the impedance of the transition metal oxide portions 109 to a load impedance $Z_0$. This will ensure that power is transferred from the input 103 to the transition metal oxide portions 109 with minimal reflections back into the transmission line 107. The bias level can be selected by incrementally adjusting the value of the bias applied by the biasing means 113 until the matching level is determined. Once the matching bias level has been determined the value of this bias can be stored in a look up table or other suitable means. The stored value of the bias can be used to switch the switching apparatus 101 between an off state and an on state.

Figure 3:
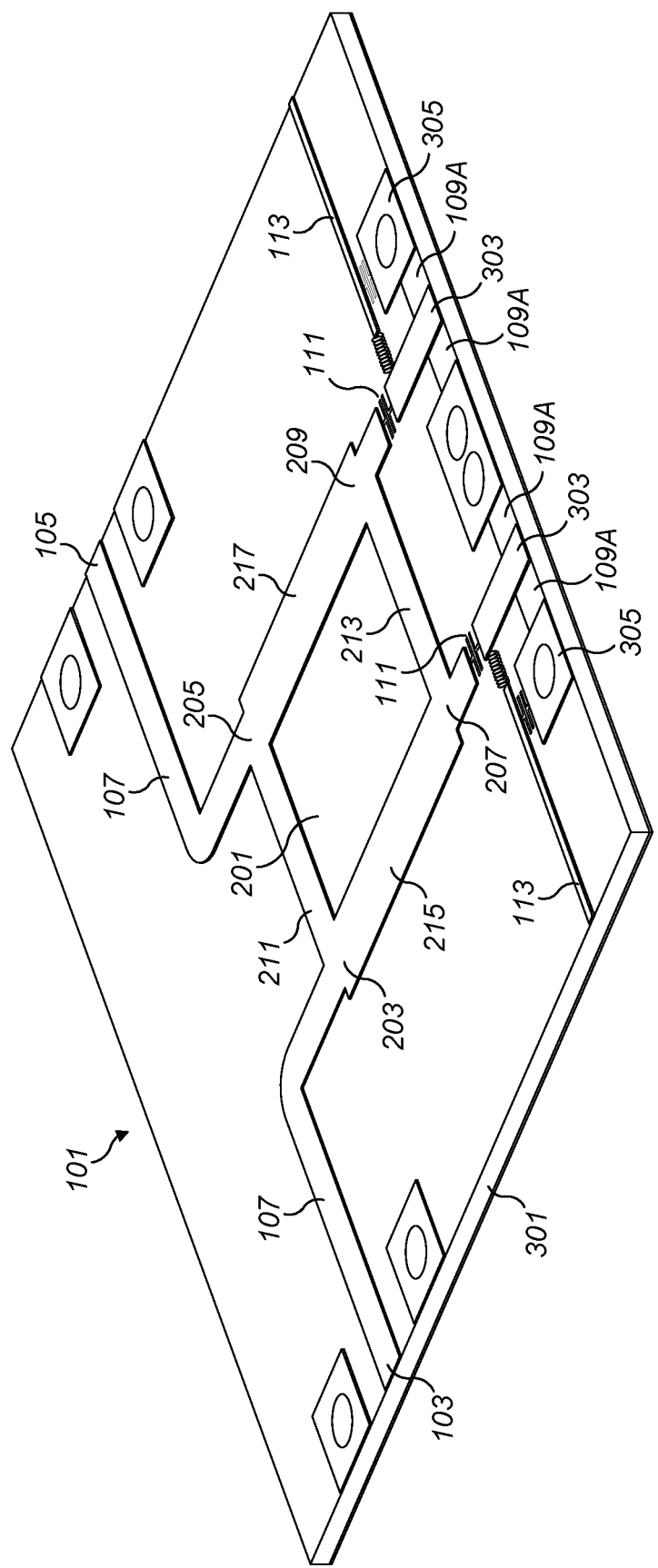
FIG. 3 shows another example of the subject matter described herein.

FIG. 3 shows an example implementation of the switching apparatus 101 shown schematically in FIG. 2. Corresponding reference numerals are used for corresponding features. The switching apparatus 101 is provided on a substrate 301. The substrate 301 comprises any suitable non-conductive material. FIG. 3 only shows the section of the substrate 301 comprising the switching apparatus 101. It is to be appreciated that other components could also be provided on the substrate 301. For instance, one or more antennas could also be provided on the substrate 301 and could be controlled by the switching apparatus 101.

In the example of FIG. 3 each of the four arms 211, 213, 215, 217 of the coupling means 201 are the same length so that the four ports 203, 205, 207, 209 of the coupling means 201 are connected in a square configuration. In some examples the lengths of the arms 211, 213, 215, 217 of the coupling means 201 can be related to the frequency of the input signal provided to the switching apparatus 101. In some examples the arms 211, 213, 215, 217 of the coupling means 201 can have an electrical length of a quarter wavelength of the frequency of the input signal.

Where the arms 211, 213, 215, 217 have a fixed length the impedance of the arms 211, 213, 215, 217 of the coupling means 201 can be determined by the width of the conductive traces. In the example shown in FIG. 3 the arms 215, 217 between the transmission line 107 and the transition metal oxide portions 109 have a larger width than the arm 211 between the input 103 and output 105 and the arm 213 between the two transition metal oxide portions 109. This provides a lower impedance for the arms 215, 217 connecting the transmission line 107 to the transition metal oxide portions 109.

The length of the transmission line 107 between the input 103 and the coupling means 201 and between the coupling means 201 and the output 105 can be any suitable length. In some examples the length of transmission line 107 can be kept as short as possible so as to avoid losses.

In the example of FIG. 3 signal paths 303 are provided between the coupling means 201 and the transition metal oxide portions 109. A first signal path 303 is provided between the third port 207 of the coupling means 201 and a first transition metal oxide portion 109 and second signal path 303 is provided between the fourth port 209 of the coupling means 201 and a second transition metal oxide portion. The first and second signal paths 303 can be identical. The first and second signal paths 303 can have identical electrical characteristics.

One or more capacitors are provided in the signal paths 303 to provide direct current blocking means 111 between the coupling means 201 and the transition metal oxide portions 109. The one or more capacitors provide a discontinuity in the conductive direct current path provided by the signal paths 303.

The transition metal oxide portions 109 are electrically coupled to the signal paths 303. The transition metal oxide portions 109 are electrically coupled to the signal paths 303 so that charge can be transferred between the transition metal oxide portions 109 and the signal paths 303.

In the example of FIG. 3 the transition metal oxide portions 109 are provided on the substrate 301 adjacent to the signal paths 303. In the example of FIG. 3 the transition metal oxide portions 109 are provided on either side of the signal paths 303. Contact pads 305 are provided adjacent to the transition metal oxide portions 109 to provide a ground for the transition metal oxide portions 109 when they are in a conductive configuration. The contact pads 305 can also enable the transition metal oxide portions 109 to be connected to biasing means 113.

In the example switching apparatus 101 of FIG. 3 the two transition metal oxide portions 109 are identical. The two transition metal oxide portions 109 have identical electrical characteristics. The impedances of the transition metal oxide portions 109 can be the same, the direct current bias applied to the transition metal oxide portions 109 can be the same and the signal paths 303 connecting the transition metal oxide portions 109 to the coupling means 201 can be the same. It is to be appreciated that in other examples the two transition metal oxide portions 109 can be different and can have different electrical characteristics.

Figure 4:
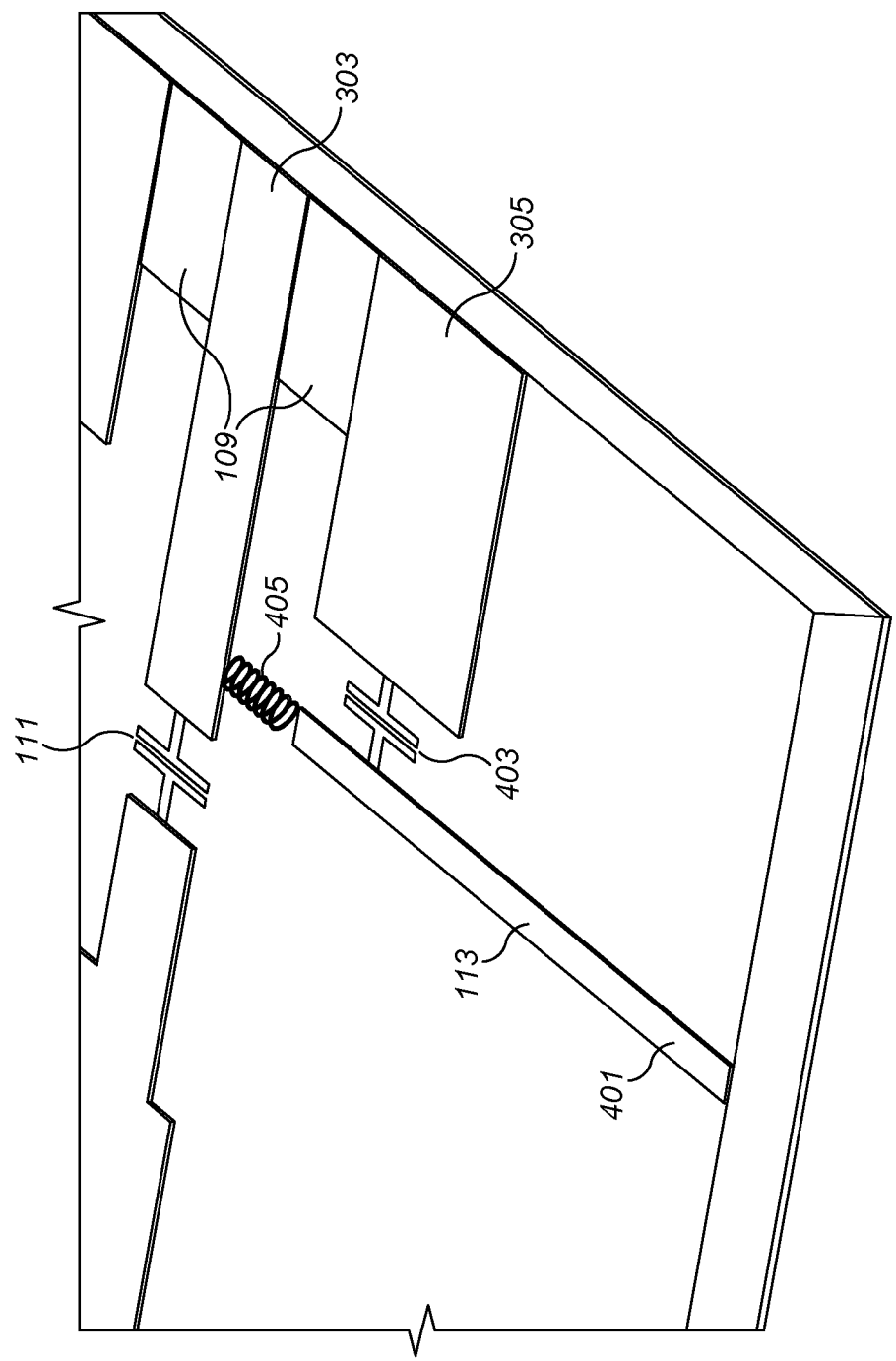
FIG. 4 shows another example of the subject matter described herein.

The biasing means 113 are configured to provide bias to the transition metal oxide portions 109. FIG. 4 shows the biasing means 113 in more detail.

As shown in FIG. 4 the biasing means 113 comprises circuitry configured to provide a direct current to the transition metal oxide portions 109. The biasing means 401 comprises a conductive trace 401 which is electrically coupled to the transition metal oxide portions 109. In the example of FIGS. 3 and 4 the conductive trace 401 is coupled to the transition metal oxide portions 109 via the signal paths 303. One or more inductors 405 are provided between the signal paths 303 and the conductive trace 401. The inductors 40 are configured to, at least partially, block radio-frequency signals from the signal path 303 from passing through to the conductive trace 401.

The biasing means 113 also comprises one or more capacitors 403. The one or more capacitors are coupled between the contact pads 305 and the conductive trace 401.

It is to be appreciated that the switching apparatus 201 of FIGS. 3 and 4 is an example and that other topologies for the switching apparatus 101 could be provided. For instance, instead of providing the transition metal oxide portions 109 adjacent to the signal paths 303 they could be provided overlaying, at least part of, the signal paths 303.

Figure 5:
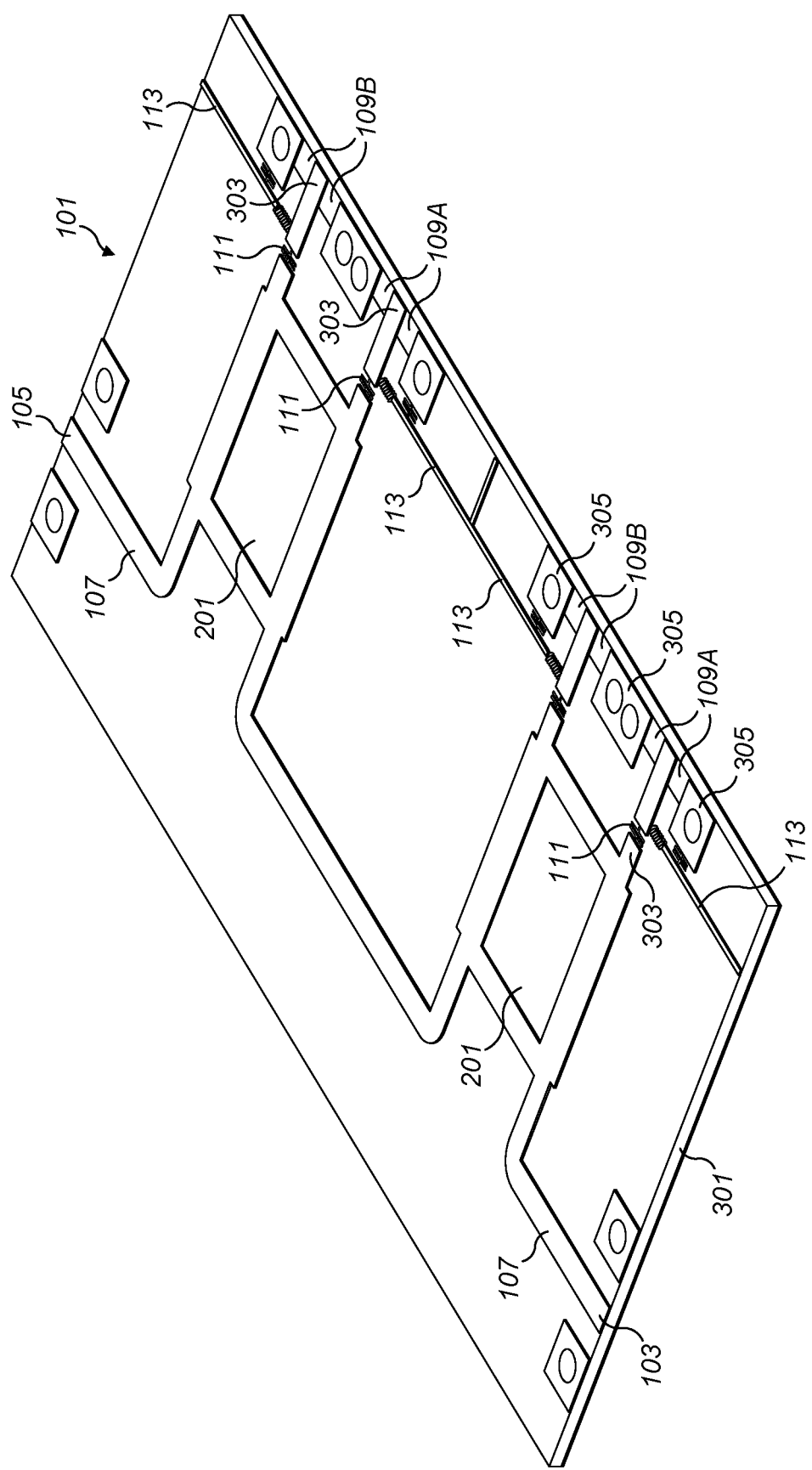
FIG. 5 shows another example of the subject matter described herein.

It is to be appreciated that the equations and descriptions given above are given for ideal components. In reality there would be some parasitic components such as stray capacitances within the components of the switching apparatus 101 which would prevent these ideal states being achieved. These parasitic components would prevent the complete annihilation of the input signal and cause at least some of the input signal to be reflected back to the transmission line 107 from the transition metal oxide portions 109. It is expected that switching apparatus as shown in FIGS. 2, 3 and 4 could support a dynamic "on"/"off" range between 15-20 dB. FIG. 5 shows another example of a switching apparatus 101 that could be configured to provide a higher dynamic range.

FIG. 5 shows a switching apparatus 101 comprising a plurality of coupling means 201 connected in series. The coupling means 201 and biasing means 113 are as shown in FIGS. 3 and 4 and corresponding reference numerals are used for corresponding features.

The plurality of coupling means 201 are connected in series between the input 103 and the output 105. The plurality of coupling means 201 provide a continuous waveguiding path between the input 103 and the output 105. Each of the coupling means 201 can be identical to the other coupling means 201. In FIG. 5 two coupling means 201 are provided. Other numbers of coupling means 201 can be provided in other examples of the disclosure.

In FIG. 5 two transition metal oxide portions 109A, 109B are coupled to each of the coupling means 201. The transition metal oxide portions 109A, 109B are coupled to the coupling means by signal paths 303 as shown in FIG. 3. Each of the transition metal oxide portions 109A, 109B can be identical to the other transition metal oxide portions 109A, 109B. Each of the transition metal oxide portions 109A, 109B can have identical electrical characteristics as the other transition metal oxide portions 109A, 109B. It is to be appreciated that in other examples the different transition metal oxide portions 109A, 109B can have different electrical characteristics.

The configuration of the switching apparatus 201 as shown in FIG. 5 provides a higher dynamic "on"/"off" range compared to the configuration shown in FIG. 3 because a plurality of coupling means 201 and transition metal oxide portions 109 are connected in series. However, the configuration shown in FIG. 5 has a longer total transmission line 107 between the input 103 and the output 105 and this would result in a higher insertion loss.

Figure 6:
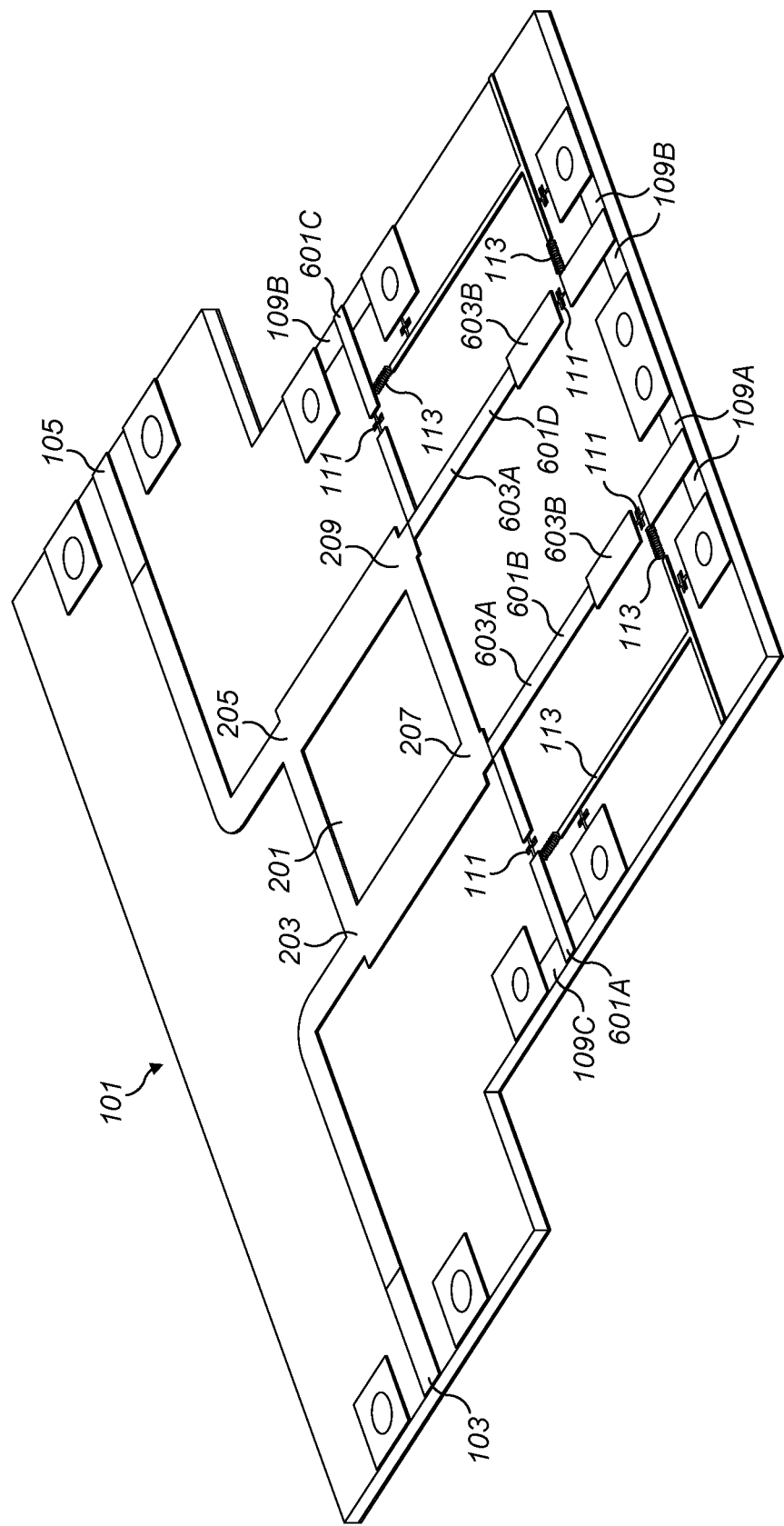
FIG. 6 shows another example of the subject matter described herein.

FIG. 6 shows an example switching apparatus 101 that can provide a higher dynamic range compared to the switching apparatus 101 of FIG. 3 without increasing the insertion losses. However, the switching apparatus 101 of FIG. 6 is more frequency selective as compared to the previous examples. This could be beneficial in applications where frequency selection is needed.

The example switching apparatus 101 of FIG. 6 comprises a single coupling means 201 with a plurality of transition metal oxide portions 109 coupled to the ports 207, 209 of the coupling means 201.

In the example of FIG. 6 two transition metal oxide portions 109A, 109C are coupled to the third port 207 and two transition metal oxide portions 109B, 109D are coupled to the fourth port 209. The transition metal oxide portions 109A, 109C, 109B, 109D and the configurations of the signal paths 601A, 601B, 601C, 601D between the coupling means 201 and the transition metal oxide portions 109A, 109C, 109B, 109D can be the same for each of the ports 207, 209.

In the example of FIG. 6 the first transition metal oxide portion 109A and the second transition metal oxide portion 109B are similar to those shown in FIGS. 2 and 3 and so corresponding reference numerals are used. The third transition metal oxide portion 109C and the fourth transition metal oxide portion 109D are additional portions as compared to FIGS. 2 and 3.

A first signal path 601A couples the third transition metal oxide portion 109C to the third port 207 and a second signal path 601B couples the first transition metal oxide portion 109A to the same port 207. The signal paths 601A, 601B have electrical lengths that are determined by the frequency of the input signal.

In the example of FIG. 6 the first signal path 601A comprises a single section that has a length of $\lambda/4$ where $\lambda$ is the wavelength of the input radio-frequency signal. The width of the first signal path 601A is such that the first signal path 601A has an impedance of $Z_0\sqrt{2}$ where $Z_0$ is the characteristic impedance of the coupling means 201.

The second signal path 601B couples the first transmission metal oxide portion 109A to the third port 201. The second signal path 601B comprises two sections 603A and 603B. The two sections 603A, 603B are connected in series with each other respectively. The first section 603A is connected between the coupling means 201 and the second section 603B. The first section 603A has a length of $\lambda/4$ and an impedance of $Z_0\sqrt{2}$. The second section 603B is connected between the first section 603A and the first transition metal oxide portion 109A. The second section 603B has a length of $\lambda/4$ and an impedance of $Z_0$. The second section 603B is thicker than the first section 603A to ensure that the second section 603B has the lower impedance.

The signal paths 601C, 601D coupling the other pair of transition metal oxide portions 109B, 109D to the fourth port 209 of the coupling means 201 are the same as the signal paths 601A, 601B coupled to the third port 207. In particular the third signal path 601C which connects the fourth transmission metal oxide portion 109D comprises one section similar to the first signal path 601A. The fourth signal path 601D comprises two sections 603A, 603B similar to the second signal path 601B. Corresponding reference numerals are used for corresponding signal paths.

In the example of FIG. 6 the lengths of the signal paths 601 are determined by the frequency of the input signal. This causes the switching apparatus 101 to be frequency selective. Such configurations of the switching apparatus 101 could be used in applications where some frequency pre-filtering could be useful.

Figure 7:
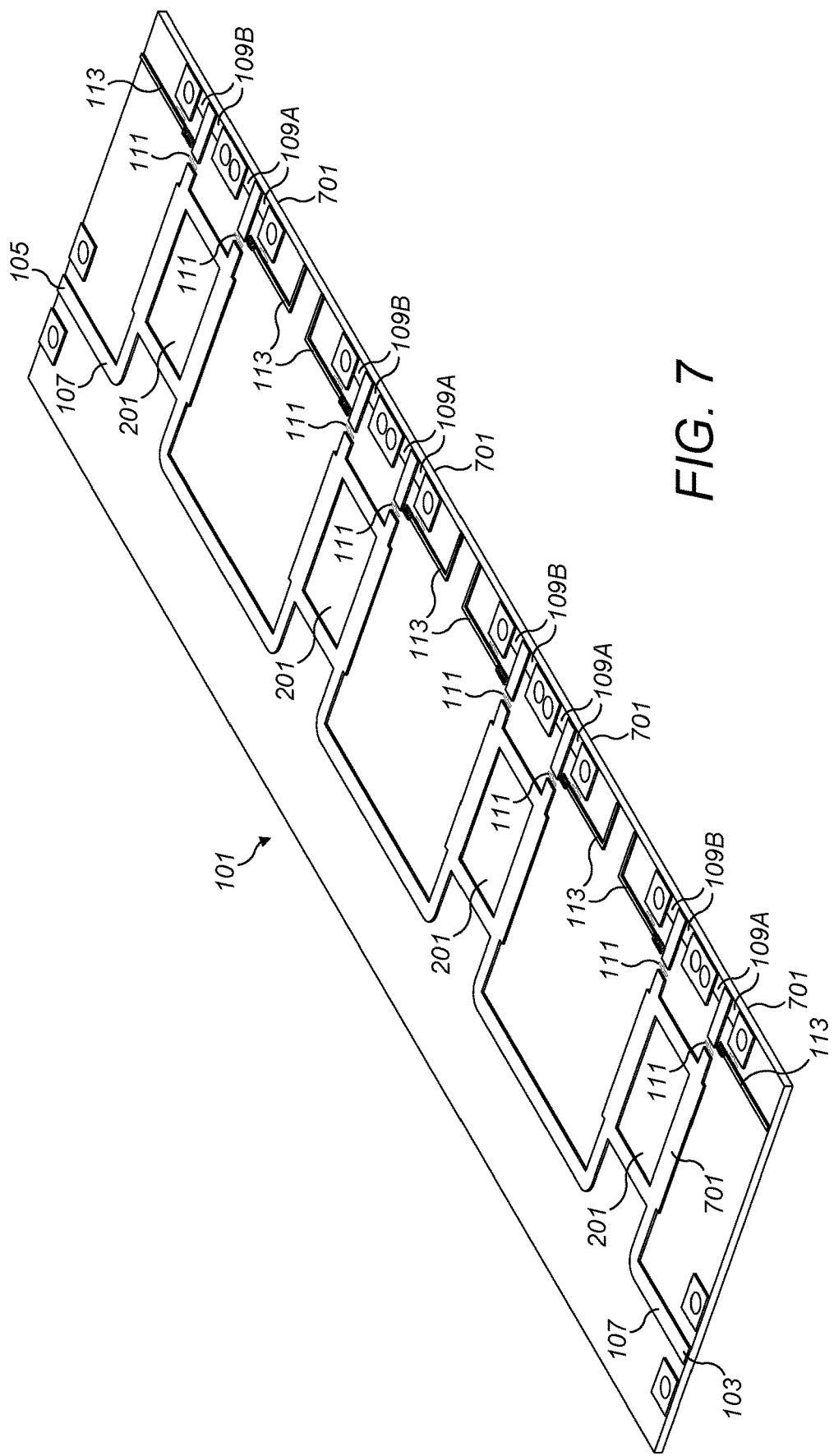
FIG. 7 shows another example of the subject matter described herein.

FIG. 7 shows another example switching apparatus 101. The example switching apparatus 101 of FIG. 7 can be configured to provide a plurality of different attenuation states.

The switching apparatus 101 in FIG. 7 comprises a plurality of coupling means 201 connected in series between the input 103 and the output 105. The plurality of coupling means 201 provide a continuous conductive path between the input 103 and the output 105. In FIG. 7 four coupling means 201 are provided. Other numbers of coupling means 201 can be provided in other examples of the disclosure. The plurality of coupling means 201 can be excited individually to provide switching bits that enable different attenuation states.

In FIG. 7 two transition metal oxide portions 109 are coupled to each of the coupling means 201. The transition metal oxide portions 109 can be coupled to the coupling means 201 as described above in relation to FIGS. 3, 4 and 5.

Each of the coupling means 201 and the corresponding transition metal oxide portions 109 provide an attenuation switching bit 701 for the switching apparatus 101. As the switching apparatus 101 comprises four coupling means 201 the switching apparatus 101 therefore comprises four attenuation switching bits 701. This enables the apparatus 101 to provide $2^n$ attenuation states between the input 103 and the output 105 where n is the number of switching bits. Therefore, in the example of FIG. 7 with four attenuation switching bits 701 up to sixteen switching states can be provided. In order to provide sixteen switching states the apparatus 101 can be configured so that different combinations of switching bits 701 result in different overall attenuations.

The biasing means 113 can be configured so that the switching bits 701 can be biased independently of each other. In some examples the biasing means 113 can be configured so that the direct current bias can be provided to any one of the switching bits 701 without being provided to any of the other switching bits 701. This can enable a subset of the switching bits 701 to be switched between an on state and an off state independently of the other switching bits 701.

In the example of FIG. 7 the biasing means 113 can be configured so that the bias voltage applied by the biasing means 113 to any one or more of the transition metal oxide portions 109 of the respective switching bits 701 is either $V_o$ or $V_{max}$. In this case each of the switching bits 701 is either in an on state or an off state. However, as the switching bits 701 can be operated independently of each other this enables four different attenuation states to be provided by the switching apparatus 101. In a first attenuation state any one switching bit 701 is active, in a second attenuation state any two switching bits 701 are active, in a third attenuation state any three switching bits 701 are active and in a fourth attenuation state all four switching bits 701 are active.

In the fourth attenuation state the switching apparatus 101 can be considered to be fully open. In the fully open state the minimum power is transferred between the input 103 and the output 105 and the power absorbed by the transition metal oxide portions 109 is at a maximum. In the first, second and third attenuation states the switching apparatus 101 can be considered to be partially open, some of the power from the input signal will be absorbed by the transition metal oxide portions 109 so that the amount of power transferred between the input 103 and the output 105 is less than the maximum.

When none of the switching bits 701 are active then the switching apparatus 101 is in a closed state. In the closed state none, or substantially none, of the power from the input signal is provided to the transition metal oxide portions 109 so that maximum power is transferred between the input 103 and the output 105.

The number of switching states available for the switching apparatus 101 can be increased by providing more switching bits 701 within the switching apparatus 101. In some examples the number of switching states can be increased by increasing the number of values available for the direct current bias. For instance, if the biasing means 113 is configured to provide either $V_0$, $V_x$ or $V_{max}$, where $V_x$ is a value between $V_0$ and $V_{max}$ then this can enable up to thirteen different states to be provided by the switching apparatus 101 of FIG. 7.

In this example there are three values $V_0$, $V_x$ or $V_{max}$, for the bias from the biasing means 113. This therefore reduces the available number of attenuation states from sixteen to thirteen. The number of available attenuation states can be increased by enabling different values of the bias from the biasing means 113. For example the biasing means 113 could be configured to provide $V_0$, $V_x$, $V_y$ or $V_{max}$ where $V_x$ has a different value to $V_y$.

Figure 8:
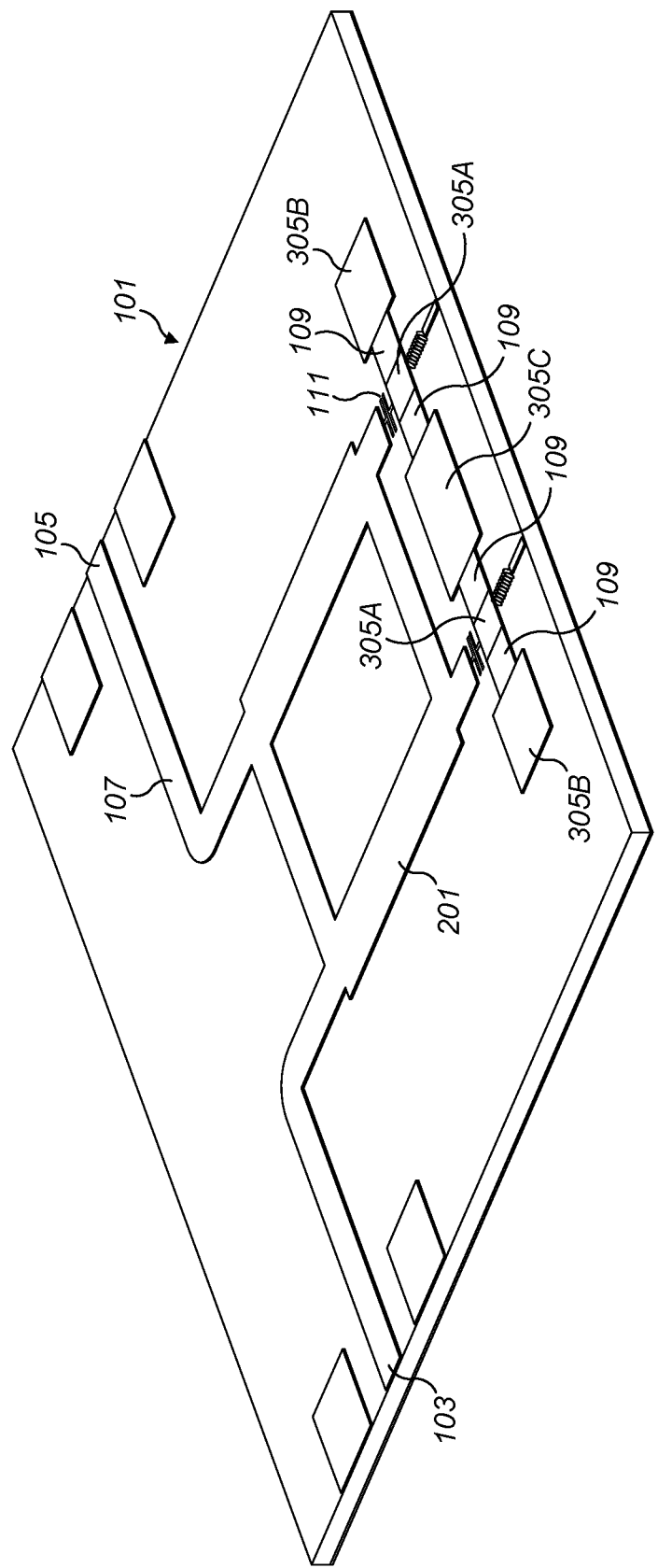
FIG. 8 shows another example of the subject matter described herein.

FIG. 8 shows another example apparatus 101 in which the signal paths 303 between the coupler 201 and the transition metal oxide portions 109 are reduced in length compared to the examples shown in FIGS. 3 to 7. In the example shown in FIG. 8 only a direct current blocking means 111 and a contact pad 305A are provided between the transition metal oxide portions 109 and the coupling means 201.

In this example the biasing means 113 comprises contact pads 305B and 305C which are electrically coupled to the transition metal oxide portions 109 and enable a direct current to be provided to the transition metal oxide portions 109. The contact pads 305B, 305C can also provide a ground for the radio-frequency signals.

Figure 9:
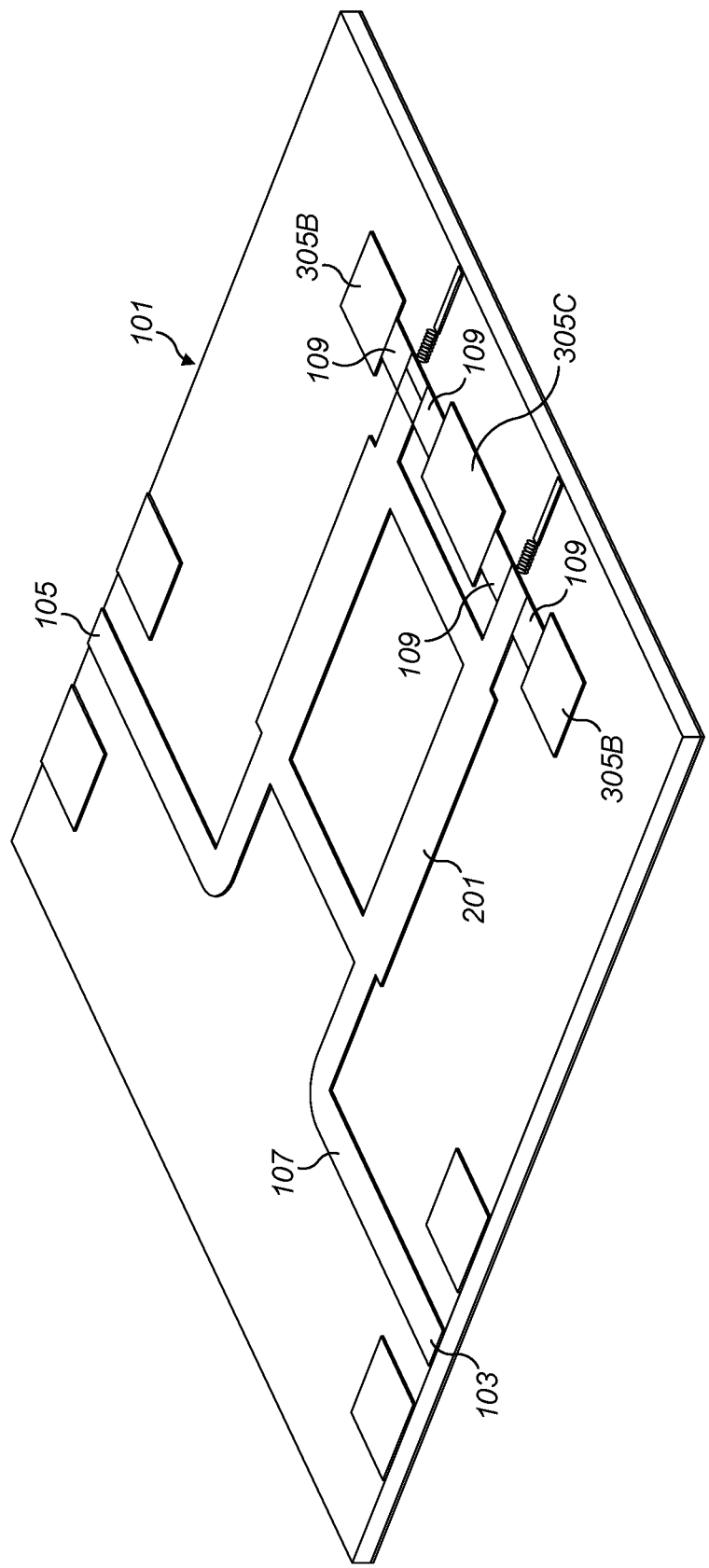
FIG. 9 shows another example of the subject matter described herein.

FIG. 9 shows another example apparatus 101 in which the signal paths 303 between the coupler 201 and the transition metal oxide portions 109 are reduced in length compared to the examples shown in FIGS. 3 to 7. In the example shown in FIG. 9 the transition metal oxide portions 109 are coupled directly to a port of the coupling means 201. In this example there are no intervening components between the transition metal oxide portions 109 and the port of the coupling means 201.

In this example the biasing means 113 comprises contact pads 305B and 305C which are electrically coupled to the transition metal oxide portions 109 and enable a direct current to be provided to the transition metal oxide portions 109. The contact pads 305B, 305C can also provide a ground for the radio-frequency signals.

In the example of FIG. 9 the direct current blocking means 111 can be provided at the input 103 and/or output 105 of the apparatus 101.

Figure 10:
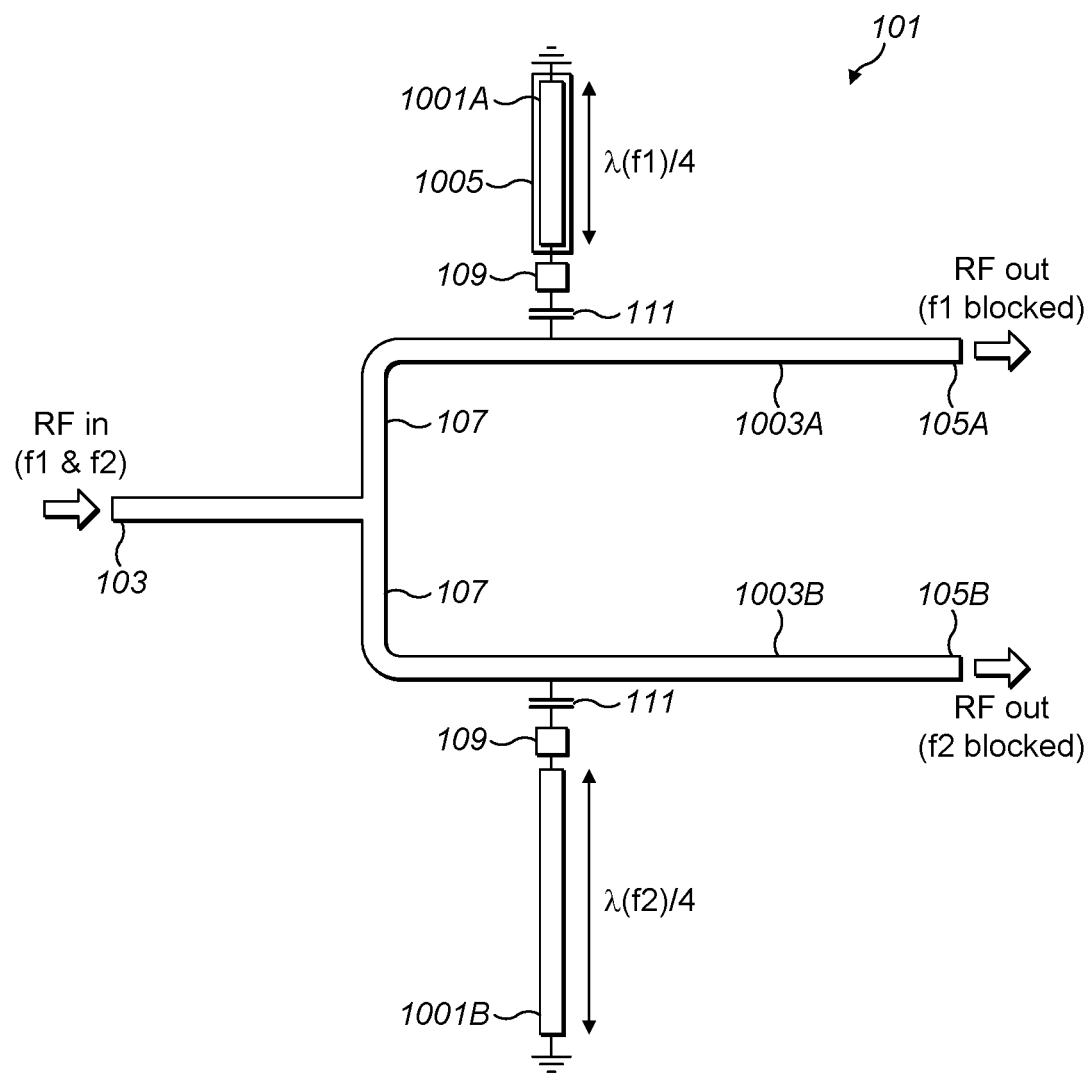
FIG. 10 shows another example of the subject matter described herein.

FIG. 10 shows another example switching apparatus 101. The switching apparatus 101 of FIG. 7 is configured to enable selective frequency blocking. The selective frequency blocking is achieved through the use of a plurality of stub lines 1001A, 1001B that are tuned to provide impedance matching at different frequencies.

The switching apparatus 101 in FIG. 10 comprises an input 103. A radio-frequency signal comprising a plurality of different frequency components is provided to the input 103. In the example of FIG. 7 the radio-frequency signal comprises a first frequency component $f_1$ and a second frequency component $f_2$.

The switching apparatus 101 also comprises two outputs 105A, 105B. A branched transmission line 107 is provided between the input 103 and each of the outputs 105A, 105B. The branched transmission line 107 provides a continuous waveguiding path between the input 103 and the first output 105A and also provides a continuous waveguiding current path between the input 103 and the second output 105B. The transmission line 107 is branched so that a first branch 1003A extends between the input 103 and the first output 105A and a second branch 1003B extends between the input 103 and a second output 105B.

A stub line 1001A, 1001B is electrically coupled to each of the branches 1003A, 1003B of the transmission line 107. A first stub line 1001A is coupled to the first branch 1003A of the transmission line 107 and a second stub line 1001B is coupled to the second branch 1003B of the transmission line 107. The stub lines 1001A, 1001B are coupled to the branches 1003A, 1003B of the transmission line 107 via one or more transition metal oxide portions 109 and one or more direct current blocking means 111.

The transition metal oxide portions 109 are positioned between the transmission line 107 and the stub line 1001A, 1001B. The transition metal oxide portions 109 are connected in series with the transmission line 107 and the stub line 1001A, 1001B.

The transition metal oxide portions 109 are also coupled to biasing means 113 that are not shown in FIG. 10. The biasing means 113 are configured to provide a direct current bias to the transition metal oxide portions 109 to enable the transition metal oxide portions 109 to transition between an insulating state and conductive state.

The switching apparatus 101 also comprises direct current blocking means 111 that are electrically coupled between the transition metal oxide portions 109 and the transmission line 107. The direct current blocking means 111 enables an alternating current signal to be transferred from the input 103 to the transition metal oxide portion 109 but prevents any direct current signal from the biasing means 113 being transferred to the transmission line 107.

When the transition metal oxide portion 109 is in a conductive state a radio-frequency signal can be transferred from the input 103 to the corresponding stub line 1001 via the transition metal oxide portion 109. When the transition metal oxide portion 109 is in an insulating state the transition metal oxide portions 109 prevents the signal from being transferred to the stub line 1001A, 1001B.

The different stub lines 1001A, 1001B have different electrical lengths. The electrical lengths of the stub lines 1001A, 1001B can be controlled using any suitable means. In some examples the electrical lengths can be controlled by controlling the length of the conductive paths that form the stub lines 1001A, 1001B. In some examples the stub lines 1001A, 1001B can comprise electrochromic material 1005 that can be configured to adjust the electrical length of the stub lines 1001A, 1001B. The electrochromic materials enables the electrical lengths of the stub lines 1001A, 1001B to be tuned by controlling a voltage applied to the electrochromic material 1005.

In the example of FIG. 10 the first stub line 1001A has an electrical length of $\lambda(f_1)/4$ where $\lambda(f_1)$ is the wavelength of the first frequency $f_1$ of the input signal. The second stub line 1001B has an electrical length of $\lambda(f_2)/4$ where $\lambda(f_2)$ is the wavelength of the second frequency $f_2$.

When the bias voltages are not applied to the transition metal oxide portions 109 the input signal provided to the input 103 is blocked by the insulating transition metal oxide portions 109 and so the power is transferred to the outputs 105A, 105B.

When the bias voltages are applied to the transition metal oxide portions 109 the input signal can be transferred to the stub lines 1001A, 1001B via the transition metal oxide portions 109. As the electrical length of the first stub line 1001A is $\lambda(f_1)/4$ the first frequency component of the input signal is not reflected by the first stub line 1001A and the first frequency component is not provided to the first output 105A. However, as the second frequency component is not matched to the first stub line 1001A, the second frequency component of the input signal is reflected by the first stub line 1001A. This would therefore block the first frequency components at the first output 105A but would enable the second frequency components to be transferred to the output 105A.

Similarly, the electrical length of the second stub line 1001B is $\lambda(f_2)/4$ the first frequency component of the input signal is reflected by the second stub line 1001B but the second frequency component is dissipated. This therefore enables the first frequency component to be provided to the second output 105B while the second frequency component is blocked.

In the example switching apparatus 101 of FIG. 10 the coupling of different stub lines 1001A, 1001B to the different outputs 105 therefore enables different frequency signals to be provided at the different outputs 105. It is to be appreciated that the number of frequencies to be blocked can be increased by adding additional stub lines 1001A, 1001B to the respective branches 1003 of the transmission line 107.

The examples of the disclosure therefore provide switching apparatus 101 that can be used in radio frequency applications. The switching apparatus 101 are configured to reduce unwanted reflections within the switching apparatus 101 and provide low transmission losses for the switching apparatus 101.

In this description the term coupled means operationally coupled and any number or combination of intervening elements can exist between coupled components, including no intervening elements.

The switching apparatus 101 and any other circuitry may be configured to operate in a plurality of operational resonant frequency bands of one or more antennas that can be coupled to the switching apparatus 101. For example, the operational frequency bands may include (but are not limited to) Long Term Evolution (LTE) (US) (734 to 746 MHz and 869 to 894 MHz), Long Term Evolution (LTE) (rest of the world) (791 to 821 MHz and 925 to 960 MHz), amplitude modulation (AM) radio (0.535-1.705 MHz); frequency modulation (FM) radio (76-108 MHz); Bluetooth (2400-2483.5 MHz); wireless local area network (WLAN) (2400-2483.5 MHz); hiper local area network (HiperLAN) (5150-5850 MHz); global positioning system (GPS) (1570.42-1580.42 MHz); US—Global system for mobile communications (US-GSM) 850 (824-894 MHz) and 1900 (1850-1990 MHz); European global system for mobile communications (EGSM) 900 (880-960 MHz) and 1800 (1710-1880 MHz); European wideband code division multiple access (EU-WCDMA) 900 (880-960 MHz); personal communications network (PCN/DCS) 1800 (1710-1880 MHz); US wideband code division multiple access (US-WCDMA) 1700 (transmit: 1710 to 1755 MHz, receive: 2110 to 2155 MHz) and 1900 (1850-1990 MHz); wideband code division multiple access (WCDMA) 2100 (transmit: 1920-1980 MHz, receive: 2110-2180 MHz); personal communications service (PCS) 1900 (1850-1990 MHz); time division synchronous code division multiple access (TD-SCDMA) (1900 MHz to 1920 MHz, 2010 MHz to 2025 MHz), ultra wideband (UWB) Lower (3100-4900 MHz); UWB Upper (6000-10600 MHz); digital video broadcasting—handheld (DVB-H) (470-702 MHz); DVB-H US (1670-1675 MHz); digital radio mondiale (DRM) (0.15-30 MHz); worldwide interoperability for microwave access (WiMax) (2300-2400 MHz, 2305-2360 MHz, 2496-2690 MHz, 3300-3400 MHz, 3400-3800 MHz, 5250-5875 MHz); digital audio broadcasting (DAB) (174.928-239.2 MHz, 1452.96-1490.62 MHz); radio frequency identification low frequency (RFID LF) (0.125-0.134 MHz); radio frequency identification high frequency (RFID HF) (13.56-13.56 MHz); radio frequency identification ultra high frequency (RFID UHF) (433 MHz, 865-956 MHz, 2450 MHz), frequency allocations for 5G may include e.g. 700 MHz, 3.6-3.8 GHz, 24.25-27.5 GHz, 31.8-33.4 GHz, 37.45-43.5, 66-71 GHz, mmWave, and >24 GHz).

The above described examples find application as enabling components of:

automotive systems; telecommunication systems; electronic systems including consumer electronic products; distributed computing systems; media systems for generating or rendering media content including audio, visual and audio visual content and mixed, mediated, virtual and/or augmented reality; personal systems including personal health systems or personal fitness systems; navigation systems; user interfaces also known as human machine interfaces; networks including cellular, non-cellular, and optical networks; ad-hoc networks; the internet; the internet of things; virtualized networks; and related software and services.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one." or by using "consisting".

In this description, reference has been made to various examples. The description of features or functions in relation to an example indicates that those features or functions are present in that example. The use of the term 'example' or 'for example' or 'can' or 'may' in the text denotes, whether explicitly stated or not, that such features or functions are present in at least the described example, whether described as an example or not, and that they can be, but are not necessarily, present in some of or all other examples. Thus 'example', 'for example', 'can' or 'may' refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example as part of a working combination but does not necessarily have to be used in that other example.

Although examples have been described in the preceding paragraphs with reference to various examples, it should be appreciated that modifications to the examples given can be made without departing from the scope of the claims.

Features described in the preceding description may be used in combinations other than the combinations explicitly described above.

Although functions have been described with reference to certain features, those functions may be performable by other features whether described or not.

Although features have been described with reference to certain examples, those features may also be present in other examples whether described or not.

The term 'a' or 'the' is used in this document with an inclusive not an exclusive meaning. That is any reference to X comprising a/the Y indicates that X may comprise only one Y or may comprise more than one Y unless the context clearly indicates the contrary. If it is intended to use 'a' or 'the' with an exclusive meaning then it will be made clear in the context. In some circumstances the use of 'at least one' or 'one or more' may be used to emphasis an inclusive meaning but the absence of these terms should not be taken to infer any exclusive meaning.

The presence of a feature (or combination of features) in a claim is a reference to that feature or (combination of features) itself and also to features that achieve substantially the same technical effect (equivalent features). The equivalent features include, for example, features that are variants and achieve substantially the same result in substantially the same way. The equivalent features include, for example, features that perform substantially the same function, in substantially the same way to achieve substantially the same result.

In this description, reference has been made to various examples using adjectives or adjectival phrases to describe characteristics of the examples. Such a description of a characteristic in relation to an example indicates that the characteristic is present in some examples exactly as described and is present in other examples substantially as described.

Whilst endeavoring in the foregoing specification to draw attention to those features believed to be of importance it should be understood that the Applicant may seek protection via the claims in respect of any patentable feature or combination of features hereinbefore referred to and/or shown in the drawings whether or not emphasis has been placed thereon.

The invention claimed is:

1. A switching apparatus comprising:
   at least one radio-frequency input;
   at least one radio-frequency output;
   at least one transmission line providing a signal path between the at least one radio-frequency input and the at least one radio-frequency output;
   at least one transition metal oxide portion;
   one or more capacitors configured to electrically couple between the at least one transition metal portion and the at least one radio-frequency input; and
   one or more electrodes configured to provide a bias across the at least one transition metal oxide portion to cause a material of the at least one transition metal oxide portion to undergo transitions between an electrical insulator and an electrical conductor such that power transferred between the radio-frequency input and the radio-frequency output is controlled by controlling the bias level across the at least one transition metal oxide portion.

2. The switching apparatus as claimed in claim 1 wherein the one or more electrodes are configured to provide a direct current bias or a modulated biasing signal.

3. The switching apparatus as claimed in claim 1 wherein when bias is controlled so that the at least one transition metal oxide portion is in an insulating state the switching apparatus is closed and power is transferred via the transmission line between the radio-frequency input and the radio-frequency output.

4. The switching apparatus as claimed in claim 1 wherein when bias is controlled so that the at least one transition metal oxide portion is in an, at least partially, conducting state the switching apparatus is, at least partially, open and at least some of the power provided to the radio-frequency input is not transferred to the radio-frequency output.

5. The switching apparatus as claimed in claim 4 wherein when bias is controlled so that the switching apparatus is, at least partially, open at least some of the power provided to the radio-frequency input is transferred through the at least one transition metal oxide portion.

6. The switching apparatus as claimed in claim 1 wherein the one or more capacitors is electrically coupled between the at least one transmission metal portion and the at least one transmission line.

7. The switching apparatus as claimed in claim 1 comprising at least one coupler configured to electrically couple a plurality of transition metal oxide portions to the transmission line.

8. The switching apparatus as claimed in claim 7 wherein the coupler comprises a four-port coupler.

9. The switching apparatus as claimed in claim 1 wherein the bias level applied by the one or more electrodes are selected to match the impedance of the at least one transition metal oxide portion to a load impedance.

10. The switching apparatus as claimed in claim 7 comprising a plurality of couplers connected in series and one or more transition metal oxide portions coupled to each of the coupler.

11. The switching apparatus as claimed in claim 7 comprising two transition metal oxide portions coupled to the same port of the coupler via two different transmission lines.

12. The switching apparatus as claimed in claim 1 comprising a plurality of stub lines coupled to transition metal oxide portions wherein the stub lines are designed in electrical length to block selected frequencies.

13. The switching apparatus as claimed in claim 12 wherein the electrical lengths of the stub lines are tuned using electrochromic material.

14. The switching apparatus as claimed in claim 12 comprising a plurality of radio-frequency outputs wherein different stub lines are coupled to different radio-frequency outputs to enable different frequency signals to be provided at the different radio-frequency outputs.

15. The method comprising:
inputting at least one input radio-frequency;
outputting at least one output radio-frequency;
providing a signal path between the inputting and outputting;
using at least one transition metal portion to couple with the inputting; and
biasing across the at least one transition metal oxide portion to cause a material of the at least one transition metal oxide portion to undergo transitions between an electrical insulator and an electrical conductor such that power transferred between the inputting and outputting is controlled by controlling the bias level across the at least one transition metal oxide portion.

16. The method as claimed in claim 15 wherein the biasing comprises providing a direct current bias or a modulated biasing.

17. The method as claimed in claim 15 comprising coupling a plurality of transition metal oxide portions.

18. The method as claimed in claim 15 wherein the coupling comprises using a four-port coupler.

19. The method as claimed in claim 15 wherein the biasing matches the impedance of the at least one transition metal oxide portion to a load impedance.

20. The method as claimed in claim 18 comprising coupling using two transition metal oxide portions coupled to the same port of the four-port coupler.

* * * * *